(12) United States Patent
Schuster et al.

(10) Patent No.: US 7,704,550 B2
(45) Date of Patent: Apr. 27, 2010

(54) METHOD FOR THE MANUFACTURE OF AN INSULATION BOARD

(75) Inventors: Johann Schuster, Oberasbach (DE); Lothar Schön, Neunkirchen (DE); Stefan Stocker, Grossenseebach (DE)

(73) Assignee: Siemens Aktiengesellschaft, Munich (DE)

( * ) Notice: Subject to any disclaimer, the term of this patent is extended or adjusted under 35 U.S.C. 154(b) by 1024 days.

(21) Appl. No.: 11/417,995

(22) Filed: May 3, 2006

(65) Prior Publication Data

US 2006/0269674 A1 Nov. 30, 2006

(30) Foreign Application Priority Data

May 3, 2005 (DE) .......................... 10 2005 020 689

(51) Int. Cl.
*B05D 1/12* (2006.01)

(52) U.S. Cl. ...................................... 427/202; 427/204

(58) Field of Classification Search ................. 427/202, 427/204
See application file for complete search history.

(56) References Cited

U.S. PATENT DOCUMENTS

| | | | |
|---|---|---|---|
| 3,787,277 A * | 1/1974 | Oomen et al. | 442/8 |
| 5,235,283 A | 8/1993 | Lehne et al. | |
| 6,042,894 A * | 3/2000 | Goto et al. | 427/504 |
| 2005/0261385 A1 * | 11/2005 | Rasmussen et al. | 521/31 |

FOREIGN PATENT DOCUMENTS

DE 103 15 539 10/2004

* cited by examiner

*Primary Examiner*—Frederick J Parker
(74) *Attorney, Agent, or Firm*—Schiff Hardin LLP

(57) ABSTRACT

In a method for the production of an insulated plate for a gradient coil, bodies that serve as spacers for the creation of flow paths for a casting resin are produced on a base by a plate having apertures therein being used to spread the bodies on the base or to mold the bodies on the base from a moldable material.

12 Claims, 2 Drawing Sheets

METHOD FOR THE MANUFACTURE OF AN INSULATION BOARD

BACKGROUND OF THE INVENTION

1. Field of the Invention

The present invention relates to a method for the manufacture of an insulation board for a gradient coil, of the type wherein bodies that serve as spacers during the manufacture of the flow paths for the casting resin are mounted on a base.

2. Description of the Prior Art

Gradient coils for magnetic resonance imaging scanners (MRI scanners) are designed such that several coil conductor layers, which are used to generate magnetic fields, are electrically insulated from each other by interleaving insulation boards. After the assembly of the coil, the interstices inside the coil are filled with a casting resin under a vacuum. In order for the gradient coil to function as desired, all interstices must be perfectly filled, because defects such as contraction cavities, improperly impregnated spots, or air pockets may result in partial discharges or short circuits. Defects of this kind can even cause a total failure of a gradient coil. Defects must also be prevented due to the significant forces that arise during the operation of the magnetic resonance imaging scanner.

In order to facilitate the flow of the casting resin into the interstices, it has already been proposed to put a suitable spacer between the individual layers of copper coils and insulation layers in order to hold open the flow path for the filling compound in the right direction. For example, mutually interconnected plastic pins are used as such spacers. It is also possible to wind plastic strings around the coil with regular spacing between them. These plastic strings are then squeezed in order to hold open the flow path for the rising casting resin.

DE 103 15 539 A1 discloses a gradient coil in which the insulation layers have elevated spots, between which flow paths are created for the casting resin. These elevated spots can be produced, for example, by applying a reaction resin as a chain around the insulation layer, which is subsequently cured at an increased temperature. It is difficult to produce these elevated spots in such a manner so that they all have the same distance from each other. As another option, it has been proposed for the elevated spots be stamped. A disadvantage of this method is that it requires relatively expensive tools. In addition to the initial high cost, once a certain pattern of elevated spots is created it cannot be changed so that in practical application, a large number of different and costly tools would be needed.

Furthermore, DE 41 41 514 A1 discloses a gradient coil system in which U-shaped profiles are uniformly distributed as spacers in an interstice between every two shells to be insulated. These profiles are, at least approximately, as large as the distance between the shells to be insulated. The interstices filed with a casting resin then form a structure with a high shearing stiffness.

SUMMARY OF THE INVENTION

An object of the present invention is to provide a method for the manufacture of an insulation board that can be easily implemented and requires no costly tools.

The above object is achieved in accordance with the present invention by a method of the type initially described, in which a plate with apertures is used in order to spread the bodies onto the base or to form the bodies on the base from a moldable material.

Unlike the manufacturing methods used in the current state of the art, the inventive method requires only a plate with apertures therein in order to produce the spacers on the insulation board.

According to a first embodiment of the method of the invention, sphere-like bodies can be used as spacers that are spread, through a plate designed as a screen, onto a base coated with a glue. For this purpose, first a glue in the form of an adhesive film is applied to sections of or to the total surface of the base; subsequently, sphere-like bodes are distributed, through the plate designed as a screen with apertures, onto the base.

Preferably the sphere-like bodies consist of glass. As an alternative, the bodies can be made of a plastic, particularly a thermosetting plastic. The selection of the pertinent material depends on what temperatures will be reached when the product is used as intended.

The method in accordance with the invention has the advantage that the height of the sphere-like bodies that serve as spacers can be set by selecting the appropriate sphere diameter. This means that a suitable sphere diameter is selected depending on the desired distance between the insulation board and the adjacent component. The spheres are distributed through the screen onto the base in an irregular pattern so that a sufficient number of flow paths arise for the casting resin.

If necessary, the inventive method can include a process by which the bodies spread over the base are attached to the base, such as by the pressing. For this purpose, a press plate can be used. It is also possible to press the bodies against the insulation board with a roller or a similar device. Such positive attachment insures that the same mutual distance is created everywhere on the base.

According to another alternative variant of the method of the invention, a perforated plate, i.e., a plate having apertures, is laid on the base and removed after the cast compound has cured. In this method, the perforated plate is used as a mold for the elevated points to be produced directly on the base. This method has the advantage that instead of a costly tool, only a simply-designed perforated plate is required so that the insulating board can be manufactured in a cost-effective manner. The thickness of the perforated plate to be used depends on the desired height of the elevated spots. This method achieves a particularly uniform distribution of the spacers.

The method in accordance with the invention allows the use of a casting compound or a glue as the moldable material with particular advantage. After this compound or glue cures, the perforated plate is removed so that the elevated spots, which are firmly connected to the base, remain in place. In this manner, an insulation board fitted with knobs or bumps can be produced.

A particularly clean process is achieved by a perforated plate with an anti-adhesive coating or with a polished surface. Such a perforated plate can be particularly easily removed after the moldable compound cures. It is especially easy to remove the perforated plate, which serves as a mold, if the apertures are designed in a slightly conical fashion. In this design, the slightly inclined cone surface serves as a chamfer.

The above object also is achieved in accordance with the invention by an insulated board for a gradient coil of a magnetic resonance imaging scanner manufactured by the described method.

DESCRIPTION OF THE PREFERRED EMBODIMENTS

Figure 1A:
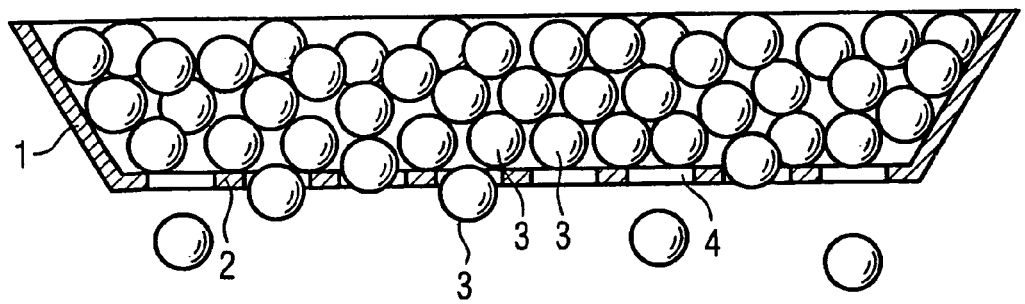
FIG. 1A shows a vessel having a bottom plate with apertures therein, sphere-like bodies, for use in a first embodiment of the inventive method.

Using FIGS. 1A to 1C, a first embodiment of a method for the manufacture of an insulated plate will be described. FIG. 1A shows a plate having apertures therein, which is designed as a vessel 1 with a screen-like bottom 2. The vessel 1 contains a stock of bodies designed as glass spheres 3. The diameters of the glass spheres 3 and the apertures 4 in the bottom 2 are matched to each other so that the glass spheres 3 fall through the bottom 2. The selection of a particular diameter of the glass spheres 3 determined the desired distance and thus also the height of the flow paths on the insulated plate.

Figure 1B:
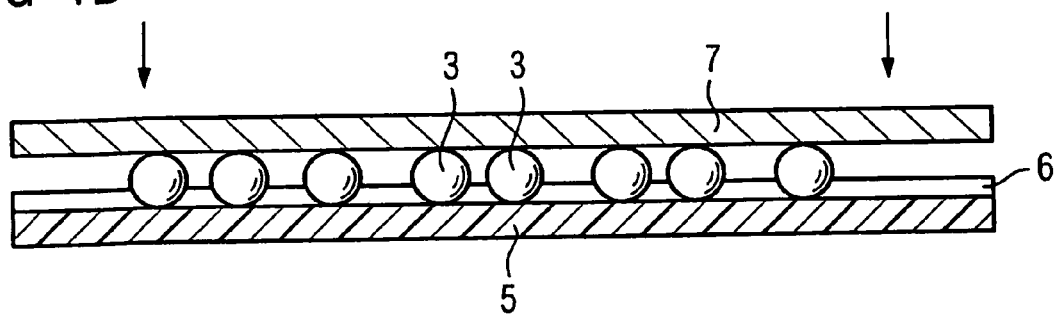
FIG. 1B shows spheres spread on a base with a press plate, for use in a first embodiment of the inventive method.

As can be seen in FIG. 1B, the glass spheres 3 fall irregularly on the base 5, which in this embodiment of the invention is a layer of plastic that is reinforced with fiberglass. The entire surface of this base 5 is coated with a glue layer 6, which holds the spread glass spheres 3 in their positions. Alternatively, the glass spheres 3 can be pressed on with a press plate 7 so that all glass spheres 3 lie exactly in the same plane. After the glue layer 6 cures, the press plate 7 is removed.

Figure 1C:
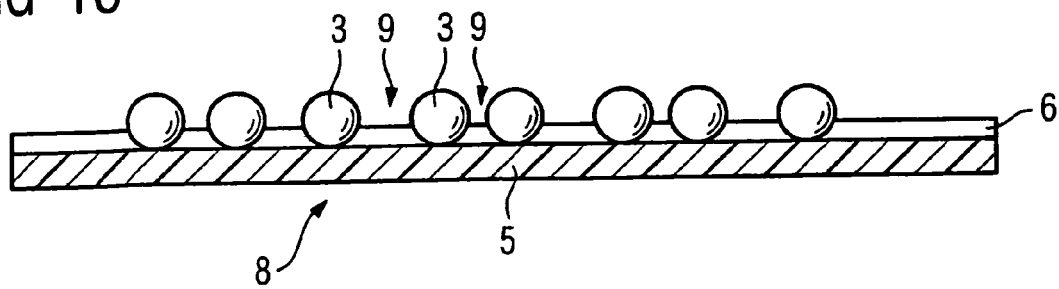
FIG. 1C shows an insulation plate manufactured in accordance with the first embodiment of the inventive method.

FIG. 1C shows a finished insulation plate 8. There exist free spaces 9 of different sizes between the individual glass spheres 3. After the insulation plate 8 is fitted with conductors, these spaces serve as flow paths for the casting resin.

Figure 2A:
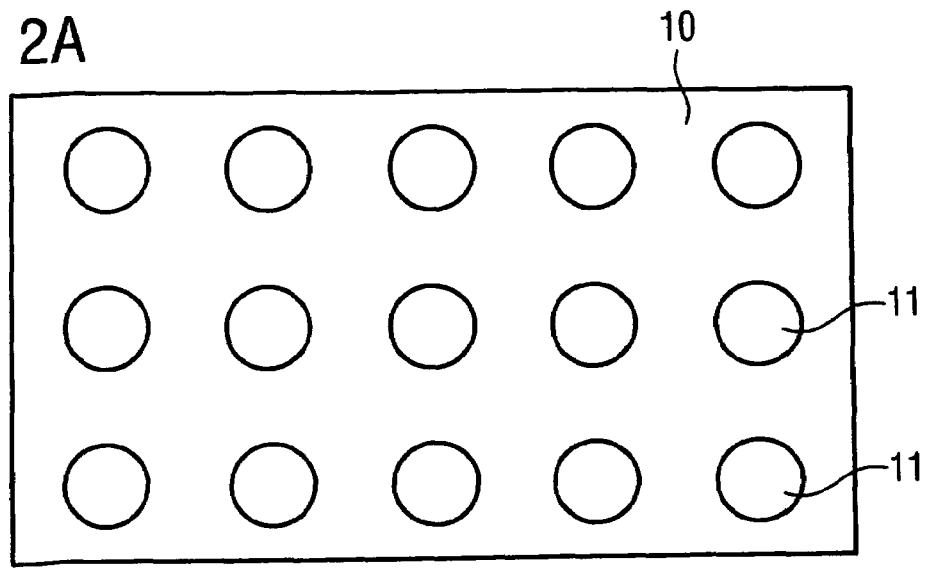
FIG. 2A shows a perforated plate for use in a second embodiment of the inventive method.
Figure 2B:
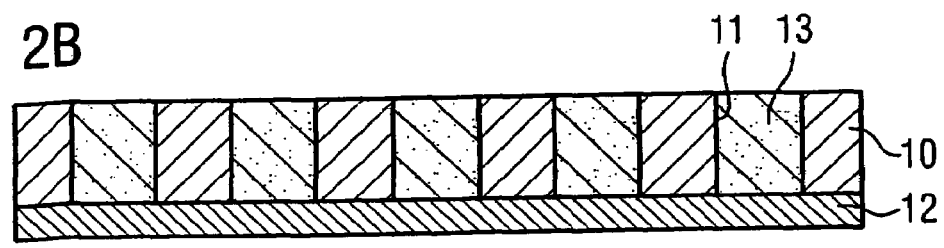
FIG. 2B shows a perforated plate lying on a base and filled with a case compound in the second embodiment.
Figure 2C:
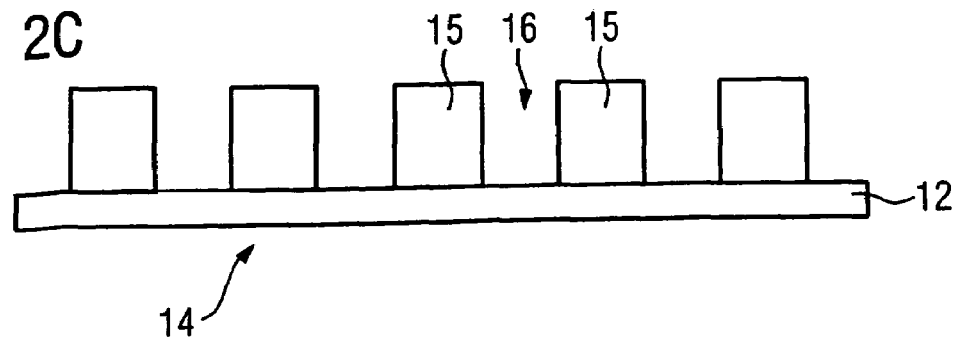
FIG. 2C shows an insulation board manufactured in accordance with second embodiment of the inventive method.

FIGS. 2A to 2C show a second exemplary embodiment of the invention. A perforated plate 10 serves as a tool that is used to manufacture the insulation board. In this embodiment, the perforated plate 10 has apertures 11 therein that are arranged in a raster pattern. It is also possible for the apertures to be arranged in a mutually offset pattern or not arranged in any particular pattern at all. The perforated plate 10 is fitted with an anti-adhesive layer to facilitate the demolding process. A polished perforated plate made of stainless steel can be used in other embodiments.

FIG. 2B shows a perforated plate 10 that has been laid on a base 12 after the apertures 11 have been filled with casting compound 13. the casting compound 13 can be, for example, a glue, a casting resin, or other more or less viscous materials. Depending on its viscosity, the casting compound 13 can either be cast into the apertures 11 in the perforated plate 10 or, alternatively, a pasty cast compound can be applied manually or by a machine using a putty knife or another auxiliary tool. If necessary, any parts of the casting compound 13 that protrude can be removed with a screed drawn over the surface of the perforated plate 10. The curing of the casting compound 13 creates a firm connection between the base 12 and the casting compound 13. After the casting compound 13 cures, the perforated plate 10 can be removed, with the removal facilitated by the demolding chamfers. The demolding process can also be made easier by applying a release agent to the perforated plate 10.

FIG. 2C shows a manufactured insulation board 14 with cylindrical knobs 15. Free spaces 16 are designed between adjacent knobs 15 at a uniform distance from each other and serve as flow paths.

Although modifications and changes may be suggested by those skilled in the art, it is the intention of the inventors to embody within the patent warranted hereon all changes and modifications as reasonably and properly come within the scope of their contribution to the art.

We claim as our invention:

1. A method for manufacturing an insulated plate for a gradient coil, comprising the steps of:

filling a material distribution container, having a bottom formed by a plate with apertures therein, with a stock of a non-electrically-conductive body-forming material;

distributing said body-forming material onto a base through the apertures of the plate by supporting said stock above said base on said plate and allowing said body-forming material to pass through said apertures onto said base, to form a plurality of bodies attached to said base in a distribution with unoccupied, open spaces respectively therebetween that produce a flow path for a casting resin; and filling said spaces between the bodies attached to the base with casting resin to form an insulated plate for a gradient coil.

2. A method as claimed in claim 1 wherein said body-forming material comprises a plurality of substantially spherical bodies, and comprising the additional step of coating a surface of said base onto which said body-forming material is distributed with a glue, prior to distributing said body-forming material on said base, and wherein the step of distributing said body-forming material on said base comprises spreading said substantially spherical bodies onto said surface of said base through said apertures in said plate.

3. A method as claimed in claim 2 comprising selecting a material for said substantially spherical bodies from the group consisting of glass and plastic.

4. A method as claimed in claim 2 comprising setting a height of said bodies on said base by selecting a diameter of said substantially spherical bodies.

5. A method as claimed in claim 2 comprising the additional step of pressing said substantially spherical bodies onto said base with a press plate.

6. A method as claimed in claim 1 wherein said body-forming material comprises a moldable compound, and wherein the step of applying said body-forming material to said base comprises placing said plate on said base and pouring said moldable said compound into said apertures in said plate, allowing said moldable compound to cure, and removing said plate.

7. A method as claimed in claimed 6 comprising selecting said moldable compound from the group consisting of casting compounds and glues.

8. A method as claimed in claim 6 comprising providing said plate with an anti-adhesive coating to facilitate removal of said plate from said base after said moldable compound has cured.

9. A method as claimed in claim 6 comprising providing said plate with an polished surface to facilitate removal of said plate from said base after said moldable compound has cured.

10. A method as claimed in claim 1 wherein said body-forming material comprises a plurality of substantially spherical bodies, and comprising selecting a diameter of said substantially spherical bodies, and a size of said aperture, to form said spaces between the substantially spherical bodies attached to said base with a height corresponding to a predetermined height of said casting resin in said insulated plate.

11. A method as claimed in claim 1 wherein said body-forming material comprises a plurality of substantially spherical bodies, and comprising distributing said substantially spherical bodies onto said base by supporting said substantially-spherical bodies at a distance above said base and allowing said substantially spherical bodies to fall through said apertures, and through said distance, onto said base.

12. A method as claimed in claim 11 comprising allowing said spherical bodies to fall through said apertures onto said base to form an irregular distribution of said substantially spherical bodies attached to said base.

* * * * *